United States Patent
Aoki et al.

(10) Patent No.: US 7,622,768 B2
(45) Date of Patent: Nov. 24, 2009

(54) SEMICONDUCTOR DEVICE AND METHOD OF MANUFACTURING THEREOF

(75) Inventors: Takaaki Aoki, Okazaki (JP); Mikimasa Suzuki, Toyohashi (JP); Yukio Tsuzuki, Nukata-gun (JP); Tomofusa Shiga, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 542 days.

(21) Appl. No.: 11/110,826

(22) Filed: Apr. 21, 2005

(65) Prior Publication Data

US 2005/0236664 A1 Oct. 27, 2005

(30) Foreign Application Priority Data

Apr. 21, 2004 (JP) ............................. 2004-125460
Mar. 25, 2005 (JP) ............................. 2005-088759

(51) Int. Cl.
*H01L 21/336* (2006.01)
(52) U.S. Cl. ................ 257/330; 438/270; 257/E21.384
(58) Field of Classification Search ................ 257/328, 257/647, 649, 330, 333, E21.384, E29.257, 257/E29.131, E29.136, E29.168; 438/259, 438/589, 270
See application file for complete search history.

(56) References Cited

U.S. PATENT DOCUMENTS

| | | | |
|---|---|---|---|
| 4,855,804 A * | 8/1989 | Bergami et al. | ............. 257/622 |
| 5,189,501 A * | 2/1993 | Kawamura et al. | .......... 257/647 |
| 5,321,289 A * | 6/1994 | Baba et al. | .................. 257/331 |
| 6,255,176 B1 * | 7/2001 | Kim et al. | .................... 438/296 |
| 6,469,345 B2 | 10/2002 | Aoki et al. | |
| 6,717,231 B2 * | 4/2004 | Kim et al. | .................... 257/510 |
| 6,897,520 B2 * | 5/2005 | Vora | ............................ 257/316 |
| 2002/0024092 A1 * | 2/2002 | Palm et al. | ................... 257/330 |
| 2002/0121661 A1 * | 9/2002 | Nakamura | .................. 257/328 |
| 2002/0167046 A1 * | 11/2002 | Aoki et al. | ................... 257/330 |
| 2004/0097036 A1 * | 5/2004 | Hsiao et al. | ................. 438/257 |

FOREIGN PATENT DOCUMENTS

| | | |
|---|---|---|
| JP | A-2000-196074 | 7/2000 |
| JP | A-2003-224274 | 8/2003 |

* cited by examiner

*Primary Examiner*—W. David Coleman
*Assistant Examiner*—Latanya Crawford
(74) *Attorney, Agent, or Firm*—Posz Law Group, PLC (57) ABSTRACT

On the surface of a silicon nitride film, there is formed a thermal oxide film, over which a CVD oxide film is then formed to provide a silicon oxide film of two-layered structure films. Moreover, the total thickness of the two-layered structure films is set to a value from 5 nm to 30 nm. Thus, the silicon oxide film is made into the two-layered structure films of the thermal oxide film and the CVD oxide film to thereby achieve the thickness of the silicon oxide film. As a result, it is possible to prevent a Vth from being lowered by a charge trap phenomenon and to prevent the Vth from fluctuating due to the enlargement of the bird's beak length by the silicon oxide film.

14 Claims, 8 Drawing Sheets

SECOND SILICON OXIDE FILM THICKNESS [nm]

FIG. 4

SECOND SILICON OXIDE FILM THICKNESS [nm]

SEMICONDUCTOR DEVICE AND METHOD OF MANUFACTURING THEREOF

CROSS REFERENCE TO RELATED APPLICATIONS

This application is based upon, claims the benefit of priority of, and incorporates by reference the contents of, Japanese Patent Application No. 2004-125460 filed on Apr. 21, 2004 and Japanese Patent Application No. 2005-88759 filed on Mar. 25, 2005.

FIELD OF THE INVENTION

The present invention relates to a semiconductor device, in which a laminated film is formed on the inner wall of a trench formed on one face of a semiconductor substrate, and a method for manufacturing the semiconductor device.

BACKGROUND OF THE INVENTION

Figure 6:
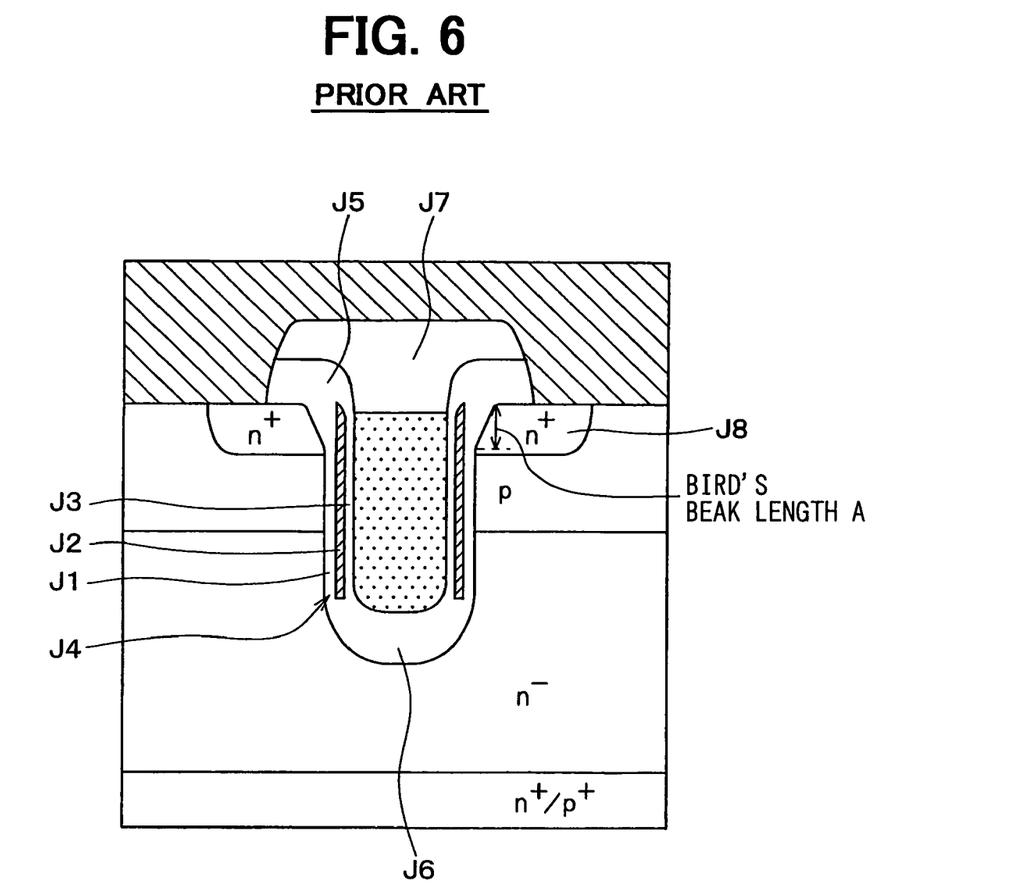
FIG. 6 is a diagram showing a sectional structure of the semiconductor device of the prior art.

Prior art power ICs such as, for example, JP-A-2001-196587 (hereafter referred to as "Patent Publication 1") disclose that an ONO film capable of improving a gate lifetime may be used as a gate insulating film in a power IC. FIG. 6 shows a sectional structure of such a power IC.

In a trench gate type IGBT or a MOS transistor, as shown in FIG. 6, there is used an ONO film J4 which is made of a three-layered structure film composed of a silicon oxide film J1, a silicon nitride film J2, and a silicon oxide film J3. If this ONO film J4 is used, the electrolytic concentration at the corner portions in a trench gate type semiconductor device, for example, can be prevented by the electrolytic relaxing effect of the silicon nitride film J2, thereby to improve the gate withstand voltage.

The electrolytic relaxing effect in the trench corner portions can be obtained by forming thick silicon oxide films J5 and J6 in the upper portion and in the bottom portion of the trench by using that ONO film J4 at the trench side wall portions in the trench gate type semiconductor device.

This ONO film J4 is formed in the following manner. First, the silicon oxide film J1 to become the first oxidized film is formed on the substrate surface to have a thickness of about 40 nm by a thermal oxidization. Subsequently, the silicon nitride film J2 is formed on the surface of that silicon oxide film J1 to have a thickness of about 15 nm by a CVD method. After this, the silicon oxide film J3 to become a second oxidized film on the surface of the silicon nitride film J2 by a thermal oxidization. Thus, the ONO film J4 is formed.

On a trench gate type power device using the aforementioned ONO film J4, high-temperature gate bias tests were executed by applying at a temperature of 150° C., for example, a voltage of +20 V to a gate electrode J7. These tests have revealed such a problem that the threshold value fluctuated to the minus side with the time lapse.

Figure 7:
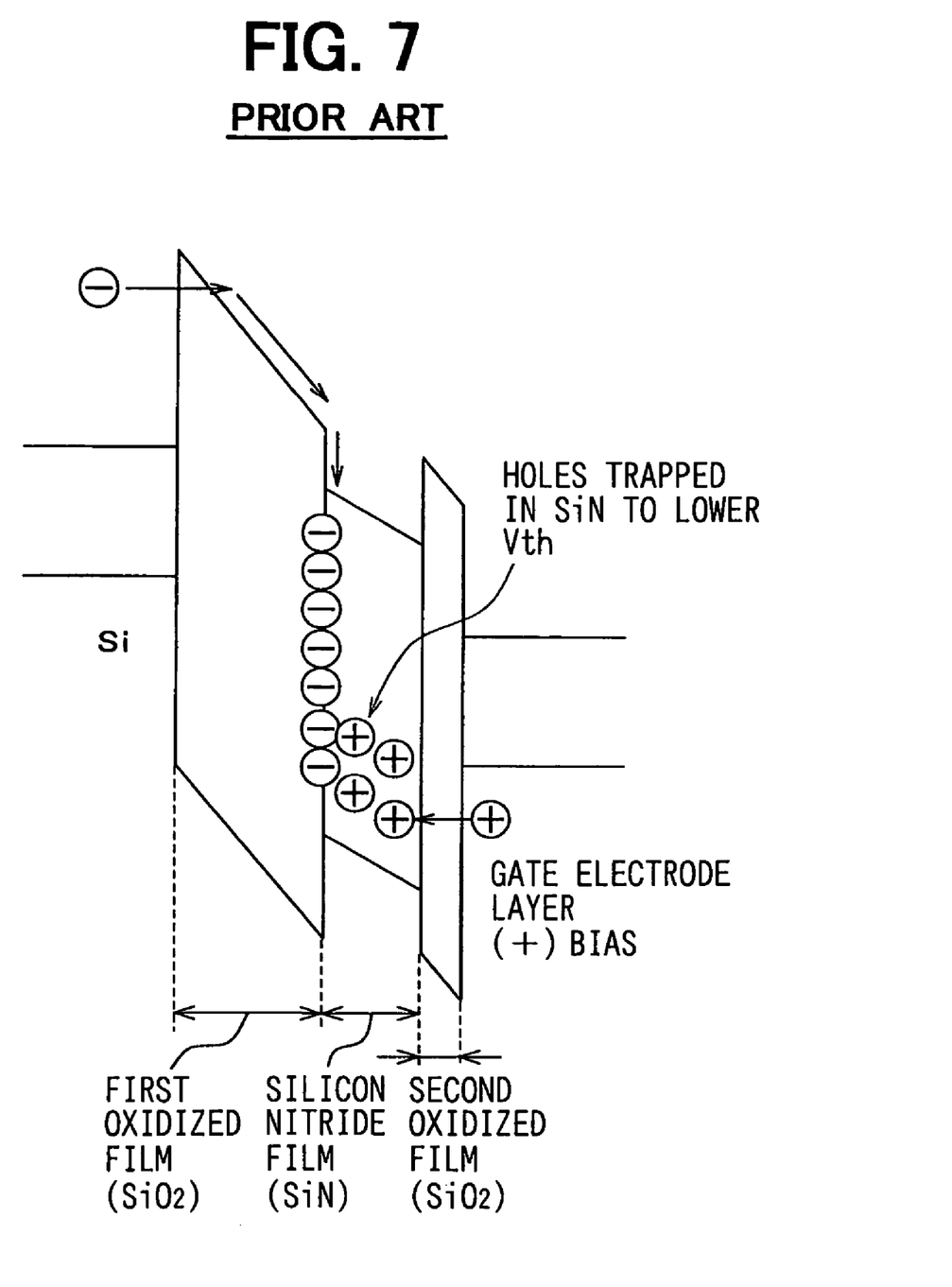
FIG. 7 is a an energy band diagram of the case, in which an ONO film is used as a gate insulating film of a trench gate type power device.

FIG. 7 is an energy band diagram of the case, in which the ONO film J4 is used as the gate insulating film of the trench gate type power device, and presents the energy band diagram at an $n^+$-type source area J8 made of Si, as shown in FIG. 6, at the ONO film J4 made of the three-layered structure film of the silicon oxide film J1, the silicon nitride film J2, the silicon oxide film J3, and at the gate electrode J7 made of Poly Si.

As a phenomenon intrinsic to the ONO film, there is the charge trap phenomenon, in which carriers are stored in the ONO film by a gate bias used for the memory effect of an EPROM thereby to fluctuate a threshold voltage (as will be called the "Vth"). In case the ONO film J4 having the aforementioned structure is used, holes are trapped in the silicon nitride film J2 from the + terminal side of a + side electrode through the silicon oxide film J3 by exemplifying the + side electrode by the gate electrode J7 adjoining the second oxidized film, as shown in FIG. 7. It is, therefore, thought that the plus voltage is apparently applied to cause the aforementioned problems.

The power IC adopts the structure, in which a plurality of cells are connected in parallel to retain an electric current. If, therefore, the Vth of partial cells is lowered by the Vth fluctuation, the electric current is concentrated at the Vth-lowered cells. As a result, the element may be broken.

SUMMARY OF THE INVENTION

In view of the points thus far described, the present invention has an object to provide a semiconductor device capable of preventing the Vth fluctuation.

Figure 8:
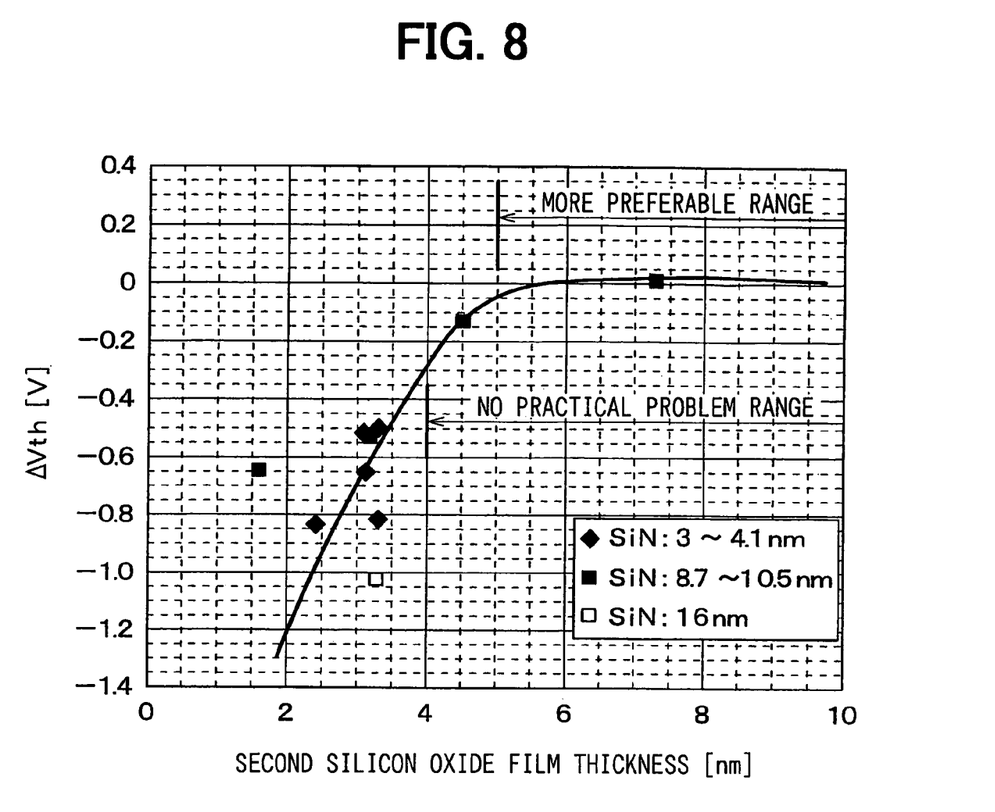
FIG. 8 is a correlation diagram showing the relationship between the thickness of the second oxide film and the variation $\Delta Vth$ of the Vth.

The inventors have determined that the silicon oxide film J3 on the side of the gate electrode 7 in the ONO film J4, that is, the second oxidized film is useful as a method for solving the aforementioned problem of the lowering Vth. FIG. 8 presents the results of the examinations of the relations between the thickness of the second oxidized film and the variation ΔVth of the Vth by varying the thickness of the silicon nitride film J2. From FIG. 8, it is found that the thickness of the second oxidized film can be set within a range of no practical problem, if it is set to 4 nm or more, and that the variation ΔVth is substantially 0, if the thickness is set as large as 5 nm or more. As a result, it is thought that the holes can be prevented to an extent of no practical problem from being trapped in the silicon nitride film J2 through the second oxidized film, if the thickness of the second oxidized film is set to 4 nm or more, while suppressing the lowering of the Vth. At the same time, a better effect can be obtained by setting the thickness to 5 nm or more, for example.

In the case of the semiconductor device, in which the portion for the ONO film J4 in the gate insulating film is restricted within the trench side wall portion and in which the upper portion and the bottom portion of the trench are restricted within the silicon oxide films J5 and J6, the thickness of a thermal oxide film to be formed on the surface of the silicon nitride film J2 is far smaller than that of a thermal oxide film to be formed on the surface of the silicon.

Assuming that the second oxidized film is to be formed by a thermal oxidation to have a thickness as large as 4 nm or more, preferably 5 nm or more, therefore, the relations of the film thickness on the cases, in which the thermal oxide film is formed on the surface of the silicon such as the upper portion and the bottom portion of the trench and in which the thermal oxide film is formed on the surface of the silicon nitride film J2 such as the trench side wall portions were investigated. The results are presented in FIG. 9.

Figure 9:
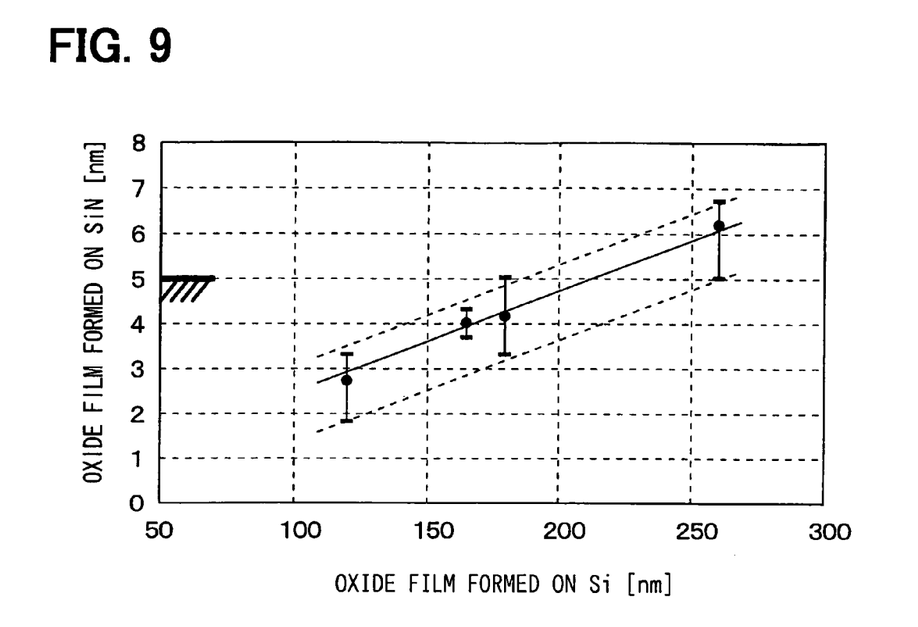
FIG. 9 is a correlation diagram showing the relationship between film thicknesses of the cases, in which a thermal oxide film is formed on the surface of silicon and on the surface of a silicon nitride film.

In case the silicon oxide film is to be formed by the thermal oxidation on the surface of the silicon nitride film, the thermal oxidation needed for setting the thickness of the silicon oxide film to 5 nm, for example, is similar to that for forming a silicon oxide film of about 260 nm on the silicon surface, as shown in FIG. 9. If, therefore, the silicon oxide film on the surface of the silicon nitride film is to be formed exclusively by the thermal oxidation, the heat treatment time is elongated to enlarge the bird's beak length A by the silicon oxide film J1, as shown in FIG. 6.

In case the $n^+$-type source area J8 has a junction depth of 0.5 microns, for example, the channel concentration peak is estimated at 0.63 microns by simulations. Theoretically, however, the bird's beak length A affects the Vth if it exceeds that channel concentration peak value. The results of the simulations of the relationship between the bird's beak length A and the Vth have confirmed that the channel concentration peak affected the Vth, as estimated, if it exceeded 0.63 microns.

Therefore, investigations have been made on the relationship between the thickness of the silicon oxide film and the bird's beak length at the time when the silicon oxide film was formed by the thermal oxidation on the surface of the silicon. The results are presented in FIG. 10, from which it is found that the thickness of the silicon oxide film has to be about 230 nm or less so as to set the bird's beak length A to 0.63 microns or less.

If, therefore, the second oxidized film in the ONO film J4 to be formed at the trench side wall portions is made thick, it is possible to prevent the Vth from being lowered as the holes are trapped by the silicon nitride film J2. If, however, the thickness of the second oxidized film is enlarged only by the thermal oxidation, the Vth fluctuates due to the enlargement of the bird's beak length A. Thus, the bird's beak length A can be prevented, by making the second oxidized film of a two-layered structure composed of a thermal oxide film and a CVD oxide film, from being enlarged to a length for causing the fluctuation of the Vth while retaining the thickness of the second oxidized film.

Therefore, a semiconductor device according to a first aspect is characterized in that the second silicon oxide film (6c) is made of two-layered structure films including a thermal oxide film formed on the surface of the silicon nitride film (6b) and a CVD oxide film formed over the thermal oxide film; and in that the total thickness of the two-layered structure films is set to a value from 4 nm to 30 nm.

Thus, the second silicon oxide film is made of the two-layered structure films of the thermal oxide film and the CVD oxide film. Moreover, the total thickness of the two-layered structure films is set to 4 nm or more. It is, therefore, possible to prevent the Vth to an extent of no practical problem from being lowered due to the charge trap phenomenon, and to prevent the Vth from fluctuating due to the enlargement of the bird's beak length by the second silicon oxide film. It is, therefore, possible to prevent the element from being broken by the concentration of an electric current at partial cells.

Preferably, in this case, according to a second aspect, the thickness of the second silicon oxide film (6c) is set to a value from 5 nm to 30 nm. Then, the above effect can be obtained more effectively.

According to a third aspect, the thickness of the second silicon oxide film (6c) is set to a value from 4 nm to 10 nm. By thus setting the thickness of the second silicon oxide film (6c) to 10 nm or less, it is possible to suppress the film-forming dispersion of the second silicon oxide film (6c).

According to a fourth aspect, in case the semiconductor element is an n-channel type element, the thickness of the second silicon oxide film (6c) is set to a value from 5 nm to 10 nm.

Thus, in case the semiconductor element is of the n-channel type element, the effect defined in the first aspect can be better obtained by setting the thickness of the second silicon oxide film (6c) to 5 nm or more, and the film-forming dispersion of the second silicon oxide film (6c) can be suppressed by setting the thickness of the second silicon oxide film (6c) to 10 nm or less.

According to a fifth aspect, in case the semiconductor element is a p-channel type element, the thickness of the second silicon oxide film (6c) is set to a value from 4 nm to 6 nm.

Thus, in case the semiconductor element is the p-channel type element, the hot electrons can be prevented from residing in the second silicon oxide film (6c) by setting the thickness of the second silicon oxide film (6c) to a value of 6 nm or less. Therefore, it is possible to prevent the second silicon oxide film (6c) from being charged with the hot electrons, thereby to prevent the Vt from fluctuating.

According to a sixth embodiment, in the second silicon oxide film (6c) thus configured, in case the semiconductor element is the IGBT, the oxide film is set to a thickness from 2.5 nm to 6 nm, and the remainder is made of the CVD oxide film. According to a seventh embodiment, in case the semiconductor element is the MOS transistor, the oxide film is set to a thickness from 1.5 nm to 4 nm, and the remainder is made of the CVD oxide film.

It is preferred that the semiconductor device as set forth in the first to seventh aspects are applied to a semiconductor device in which the gate insulating film (6) is made of the ONO film only on the side face of a trench (5) but made of silicon oxide films (6d and 6e) in the upper portion and in the bottom portion of the trench, as defined in the eighth aspect.

According to a ninth aspect, a method for forming a semiconductor device is characterized: in that the step of forming the second silicon oxide film (6c) includes: the step of forming a thermal oxide film on the surface of the silicon nitride film (6b); and the step of forming a CVD oxide film over the thermal oxide film; in that the second silicon oxide film (6c) is made of two-layered structure films including: the thermal oxide film and the CVD oxide film; and in that the thicknesses of the thermal oxide film and the CVD oxide film are made such that the total thickness of the two-layered structure films is set to a value from 5 nm to 30 nm.

According to a tenth aspect, the method is characterized: in that the step of forming the second silicon oxide film (6c) includes: the step of forming a CVD oxide film on the surface of the silicon nitride film (6b); and the step of forming a thermal oxide film over the CVD oxide film; in that the second silicon oxide film (6c) is made of two-layered structure films including: the thermal oxide film and the CVD oxide film; and in that the thicknesses of the thermal oxide film and the CVD oxide film are made such that the total thickness of the two-layered structure films is set to a value from 5 nm to 30 nm.

As thus defined, a semiconductor device having the effects of the first embodiment can be attained.

Here, the parenthesized reference numerals in the aforementioned individual means designate the corresponding relations to the specific means to be described in later-described embodiments.

DETAILED DESCRIPTION OF THE PREFERRED EMBODIMENTS

Embodiments of the present invention will be described with reference to the accompanying drawings. Among the following individual embodiments, the mutually identical or equivalent portions are designated by the common reference numerals.

First Embodiment

Figure 1:
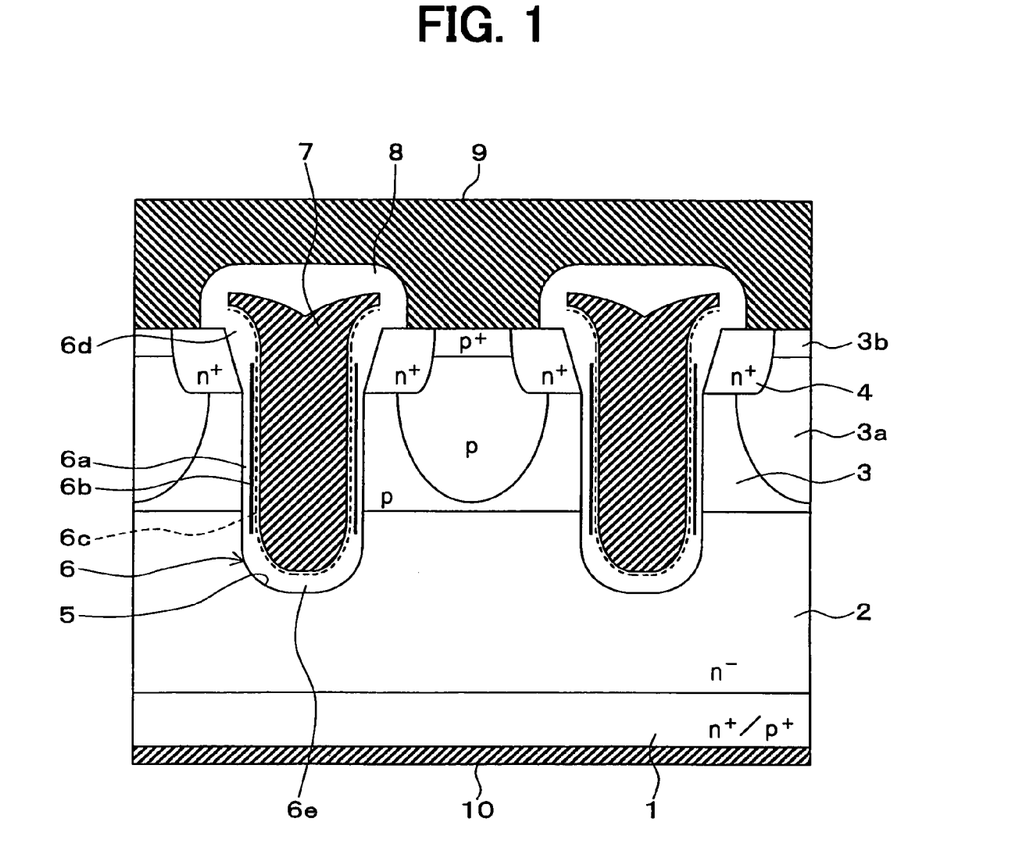
FIG. 1 is a diagram showing a sectional structure of a semiconductor device according to one embodiment of the present invention.

FIG. 1 shows a sectional structure of a semiconductor device according to one embodiment of the present invention. This semiconductor device is made to include transistors having a trench gate structure such as a power MOSFET, IGBT or the like. However, the present device will be described on the case, in which the transistors are n-channel type elements.

In FIG. 1, there is formed over an $n^+$-type or $p^+$-type silicon substrate 1 an $n^-$-type drift layer 2, over which is formed a p-type base area 3 for setting a channel area. At the central portion in this p-type base area 3, there is formed a p-type body layer 3a, on the surface portion of which is formed a $p^+$-type contact area 3b.

Moreover, an $n^+$-type source area 4 is formed in the surface layer portion of the p-type base area 3, and these silicon substrate 1, $n^-$-type drift layer 2, p-type base area 3 and $n^+$-type source area 4 configure the semiconductor substrate. In this semiconductor substrate, there is formed a trench 5 which reaches the $n^-$-type drift layer 2 through the $n^+$-type source area 4 and the p-type base area 3, and a gate insulating film 6 is formed on the inner wall of the trench 5.

The gate insulating film 6 includes: a stacked layer formed on the side wall portion of the trench 5 and is composed of a silicon oxide film (or a first oxide film) 6a, a silicon nitride film 6b and a silicon oxide film (or a second oxidized film) 6c; and silicon oxide films 6d and 6e formed in the upper portion and in the bottom portion of the trench 5.

For an IGBT, the silicon oxide film 6a generally has a thickness of 50 to 100 nm, such as about 80 nm. For a MOS transistor, the silicon oxide film 6a generally has a thickness of 50 to 70 nm, such as 60 nm.

The silicon nitride film 6b is set to have a thickness of 5 to 10 nm such as 8 nm in both the cases of the IGBT and the MOS transistor.

The silicon oxide film 6c is configured to have a two-layered structure of a portion formed of a thermal oxide film and a portion formed of a CVD oxide film. In the IGBT case, moreover, the total film thickness of the two-layered structure is set to about 4 to 30 nm such as 7 to 8 nm by giving the thermal oxide film about 2.5 to 6 nm, for example, and by giving the CVD oxide film the remainder of 1 to 27 nm such as 3 to 6 nm. In the case of the MOS transistor, on the other hand, the total film thickness of the two-layered structure is set to about 4 to 30 nm such as 7 to 8 nm by giving the thermal oxide film about 1.5 to 4 nm and by giving the CVD oxide film the remainder of 1 to 29 nm such as 5 to 6 nm.

On the other hand, the silicon nitride film 6b is formed to have its upper end positioned over the boundary between the p-type base area 3 and the $n^+$-type source area 4 and its lower end positioned below the boundary between the p-type base area 3 and the $n^-$-type drift layer 2, and the silicon oxide films 6d and 6e formed in the upper portion and in the bottom portion of the trench 5 are made thicker than the laminated films formed on the side wall portion of the trench 5.

On the surface of the gate insulating film 6 in the trench 5, on the other hand, there is formed a gate electrode 7 which is made of doped polysilicon. Over the p-type base area 3 and the $n^+$-type source area 4, as covering the gate electrode 7, there is formed an interlayer insulating film 8 which is made of BPSG or the like. A source electrode 9, as made of Al, is electrically connected with the p-type base area 3 and the $n^+$-type source area 4 through contact holes formed in that interlayer insulating film 8. On the back side of the silicon substrate 1, moreover, there is formed a back side metal electrode 10 which is made of Al.

Thus, there is configured the transistor having the trench gate structure, in which the portion belonging to the p-type base area 3 and positioned on the side face of the trench 5, that is, the portion adjoining the laminated film formed on the inner wall of the trench 5 and composed of the silicon oxide film 6a, the silicon nitride film 6b and the silicon oxide film 6c is made into the channel area.

In this structure, the portion belonging to the gate insulating film 6 and positioned on the side face of the trench 5 is made of the laminated film composed of the silicon oxide film 6a, the silicon nitride film 6b and the silicon oxide film 6c.

In the present embodiment, moreover, the silicon oxide film 6c is set to 4 nm or more, preferably 5 nm or more. Within at least the range of no practical problem, therefore, it is possible to prevent the holes from being trapped by the silicon nitride film 6b through the silicon oxide film 6c, thereby to prevent a Vth from being reduced by the charge trap phenomenon. More preferably, the effect of the silicon oxide film 6c can be more effectively obtained by setting the silicon oxide film 6c to 5 nm or more.

As a result, the Vth is lowered by the charge trap phenomenon so that the element can be prevented from being broken by the concentration of the electric current in a partial cell.

Next, a process for manufacturing the semiconductor device thus far described will be described with reference FIGS. 2A-2H.

Figure 2A:
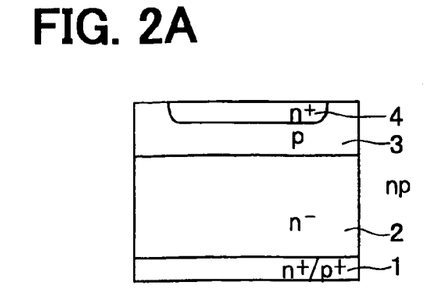
FIGS. 2A-2H are illustrations of a method for manufacturing the semiconductor device shown in FIG. 1.

First of all, at the step shown in FIG. 2A, a $p^+$-type or $n^+$-type silicon substrate 1 is prepared, and the $n^-$-type drift layer 2 is formed over that silicon substrate 1 by an epitaxial growth. Next, the p-type base area 3 and the $n^+$-type source area 4 are sequentially formed on a predetermined area of the $n^-$-type drift layer 2 by an ion implantation and a thermal diffusion. At this time, the depth of the p-type base area 3 is set to 2 to 3 microns for the IGBT case and to 1 to 2 microns for the MOSFET case, and the depth of the $n^+$-type source area 4 is set to 0.5 microns for both the IGBT case and the MOSFET case.

Figure 2B:
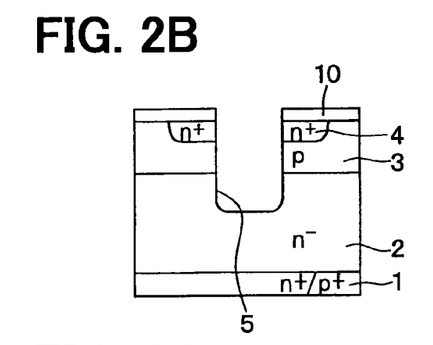

Next, at the step shown in FIG. 2B, an opening is formed in the silicon oxide film 10 by depositing the silicon oxide film 10 as a first masking material by the CVD method and then by patterning the silicon oxide film 10 by the photolithography and the dry etching method. Subsequently, the trench 5 reaching the $n^-$-type drift layer 2 through the $n^+$-type source area 4 and the p-type base area 3 is formed by an anisotropic dry etching method using the patterned silicon oxide film 10 as a mask. At this time, the trench depth is set to 4 to 6 microns for the IGBT case and to 1 to 3 microns for the MOSFET case.

Figure 2C:
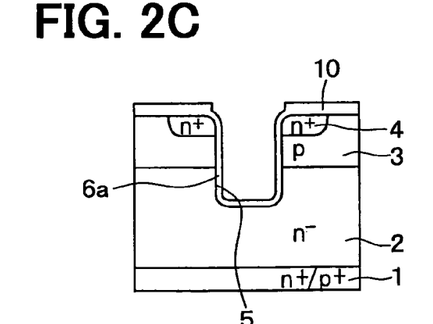

Next, at the step shown in FIG. 2C, the silicon in the trench 5 is isotropically etched off by about 0.1 microns by a chemical dry etching method using $CF_4$ and $O_2$ gases. Then, a sacrificial oxide film of about 50 to 100 nm is formed by a thermal oxidation in the atmosphere of $H_2O$ or $O_2$. After this, the etching damage is removed, and the corner portions of the trench 5 are rounded by removing the sacrificial oxide film by the wet etching method using dilute hydrofluoric acid.

At this time, the etching time may also be set to that, for which only the sacrificial oxide film is removed. If, however, the etching time is set to that, for which both the sacrificial oxide film and the trench masking silicon oxide film 10 are removed, the trench masking silicon oxide film 10 can be simultaneously etched off.

After this, the silicon oxide film 6a is formed to have a thickness of about 50 to 100 nm such as 80 nm in the IGBT case and a thickness of about 50 to 70 microns such as 60 nm in the MOS case by a thermal oxidation in the atmosphere of $H_2O$ or $O_2$.

Figure 2D:
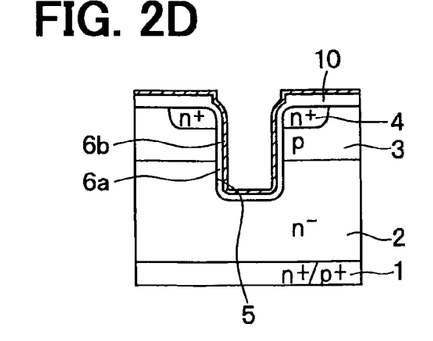

Next, at the step shown in FIG. 2D, the silicon nitride film 6b of 10 to 20 nm, for example, is formed by an LPCVD method. This film thickness takes such a value as considers the reduction at the time when the silicon oxide film 6c is later formed, and is so set that the silicon nitride film 6b may have a film thickness of about 5 to 10 nm when the semiconductor device is completed.

Figure 2E:
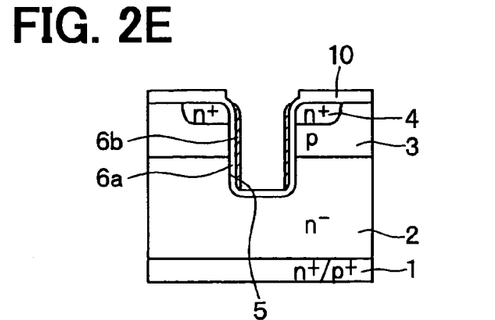

Next, at the step shown in FIG. 2E, the silicon oxide film 6a is partially exposed by an anisotropic dry etching method using $CHF_4$ and $O_2$ gas systems such that the portions of a silicon nitride film 7b, as positioned in the upper portion and in the bottom portion of the trench 5, are removed while leaving the portion positioned on the side wall portion of the trench 5.

Figure 2F:
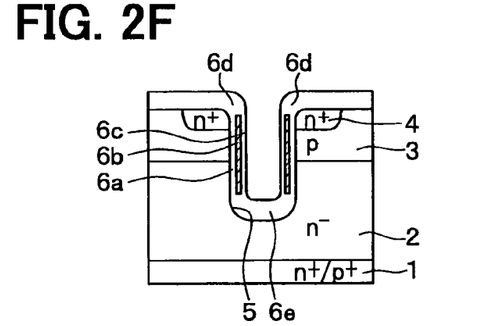

Next, at the step shown in FIG. 2F, a portion of the silicon oxide film 6c is formed over the silicon nitride film 6b by a thermal oxidation in an $H_2O$ or $O_2$ atmosphere at 950° C. At this time, in the upper portion and the bottom portion of the trench 5, from which the silicon nitride film 7b has been removed, there are formed the silicon oxide films 6d and 6e, which have larger thicknesses than that over the silicon nitride film 7b by the thermal oxidation. In order that the silicon oxide films 6d and 6e may not have excessively large thicknesses, therefore, the thermal oxidation time is set to adjust the thickness of the silicon oxide film 6c.

By this thermal oxidation, more specifically, the silicon oxide film 6c has a thickness of about 2.5 to 5 nm in the IGBT case and 1.5 to 4 nm in the MOS transistor case. As a result, the silicon oxide films 6d and 6e have thicknesses of about 250 nm in the IGBT case and 120 to 140 nm in the MOS transistor case.

Figure 10:
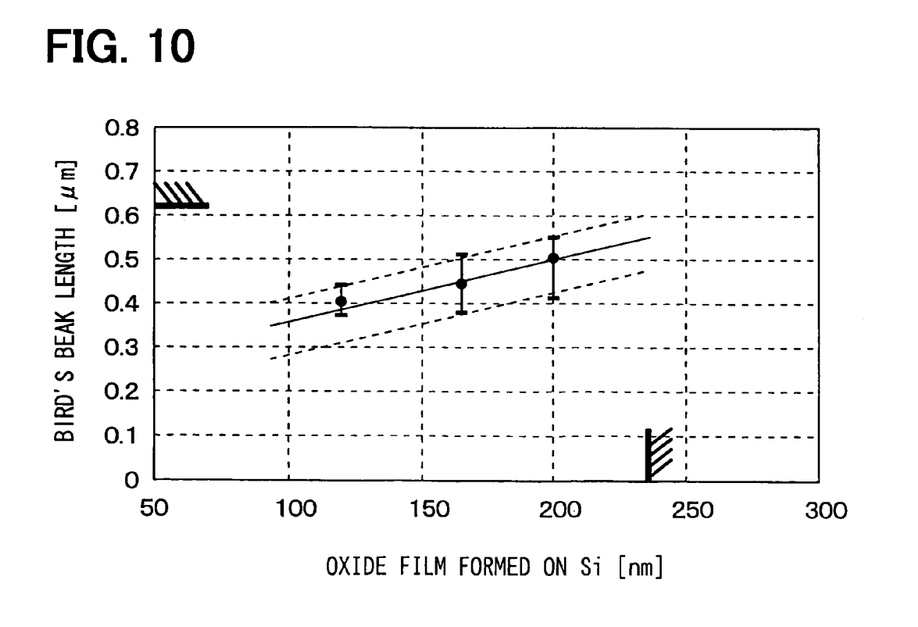
FIG. 10 is a correlation diagram showing relations between a silicon oxide film thickness on the surface of the silicon and a bird's beak length.

Here in case the channel concentration peak is 0.63 microns, as shown in FIG. 10, the thicknesses of the thermal oxide films to be formed on the silicon surface have to be about 230 nm so that the bird's beak length may be prevented from becoming excessively long, although they change according to the trench depth or the position of the channel area set according to the trench depth. Therefore, the thicknesses of the thermal oxide films to be formed on the silicon surface are suitably adjusted according to the trench depth or the like.

After this, the remaining portions of the silicon oxide film 6c are formed by forming the CVD oxide film to about 5 nm using a CVD apparatus. As a result, the silicon oxide film 6c has a thickness of about 7 to 8 nm.

At this time, the aforementioned effects can be obtained, if the total of the thicknesses of the silicon oxide film 6c is within a range from 4 nm to 30 nm, as described hereinbefore. Within this range, therefore, the thickness of the silicon oxide film 6c can be arbitrarily changed. As this thickness becomes the larger, the film-forming dispersion (or the roughness of the surface) of the silicon oxide film 6c becomes the larger. In case, therefore, the film-forming dispersion is to be held to or less than a predetermined value, it is preferred to hold the film thickness accordingly. In case the film-forming dispersion of the silicon oxide film 6c is held within about ±1 nm, for example, it is advisable that the total of the film thicknesses of the silicon oxide film 6c be 10 nm or less.

Figure 2G:
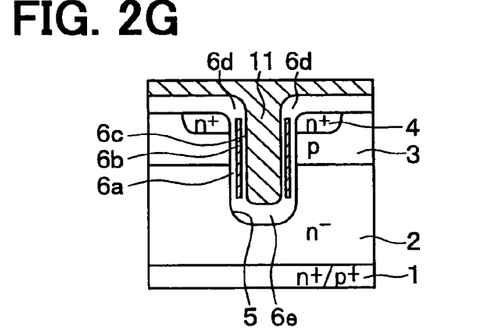

Next, at the step shown in FIG. 2G, a doped polysilicon film 11 for forming the gate electrode 7 is formed by the LPCVD method and is then etched back to a desired thickness. Here, the doped polysilicon film 11 is deposited, but may also be then doped with an impurity.

Figure 2H:
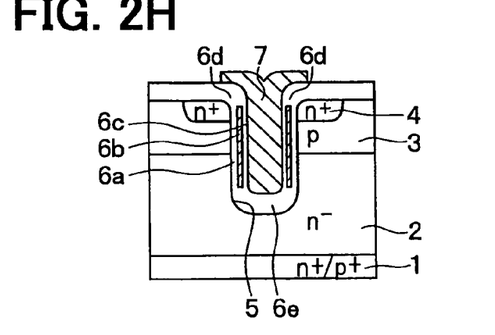

Next, at the step shown in FIG. 2H, the gate electrode layer 7 is formed by patterning the doped polysilicon film 11.

Although the subsequent manufacturing step is not shown, a body p-type layer is formed by performing an ion implantation and a thermal diffusion using a desired mask. $P^+$-type contact portions are also formed by a similar method. There are further performed the formations of the interlayer insulating film 8 by the CVD method, the contact holes in the interlayer insulating film 8 by the photolithography and the anisotropic etching method, and the electrodes such as the source electrode 9 by the sputtering method. Then, the thickness of the silicon substrate 1 is reduced by polishing its back face, and metal electrodes are formed on the back face, thereby to complete the semiconductor device which is provided with the trench gate type transistor, as shown in FIG. 1.

As described hereinbefore, the silicon oxide film 6c is set to a thickness of 5 nm and is made to have the two-layered structure of the thermal oxide films and the CVD oxide film. It is, therefore, possible to prevent the Vth from being reduced by the charge trap phenomenon and the Vth from being fluctuated due to the elongation of the bird's beak length by the silicon oxide film 6d. It is, therefore, possible to prevent the element from being broken by the concentration of the electric current in partial cells.

For reference, a gate bias test at an test temperature of 150° C. and at a gate applied voltage of 20 V was done without any drop of the Vth. The aforementioned effects can be confirmed from this experimental result.

Second Embodiment

The foregoing first embodiment has been described on the case, in which the trench-gate type transistor is of the n-channel type element, but the present embodiment will be described on the case, in which the transistor is of the p-channel type element. Here, the structure, in which the transistor is of a p-channel type element, is similar to that of the section shown in FIG. 1, and the conduction types of the individual portions are just reversed, so that the description on the structure is omitted.

Figure 3:
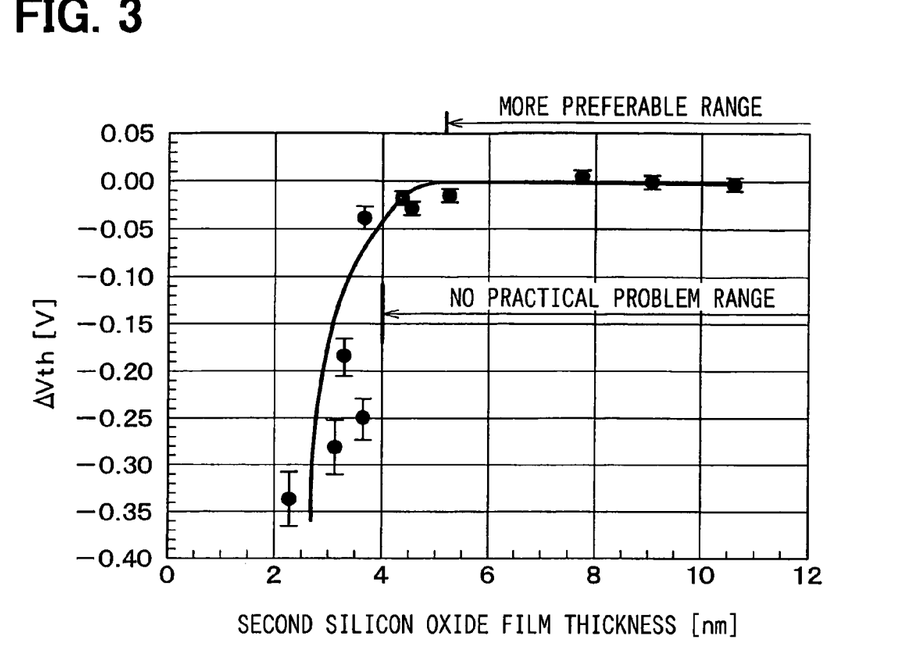
FIG. 3 is a diagram showing the relationship between the thickness of the second silicon oxide film 6c and the variation ΔVth of the Vth in the case of a p-channel type element.

As described above, the case, in which the transistor is the n-channel type element, and the case, in which the same is the p-channel type element, have basically similar structures. Therefore, a similar discussion can be made on the thickness of the silicon oxide film 6c. In the case of the p-channel type element, more specifically, the examination results of the relations between the thickness of the silicon oxide film 6c and the variation ΔVth of the Vth are presented in FIG. 3. Therefore, the Vth fluctuation can be held within a range of no practical problem by setting the thickness of the silicon oxide film 6c to 4 nm or more, preferably 5 nm or more.

Figure 4:
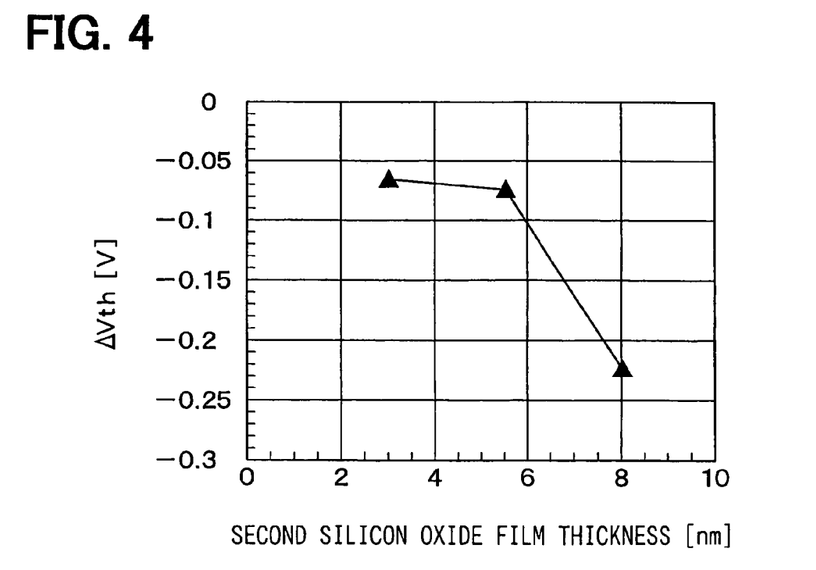
FIG. 4 is a correlation diagram showing the relationship between the second silicon oxide film and the Vt fluctuation in the case of the p-channel type element.

In the case of the p-channel type element, however, the examinations of the relations between the silicon nitride film 6b and the Vt fluctuation have confirmed the relations presented in FIG. 4.

Figure 5A:
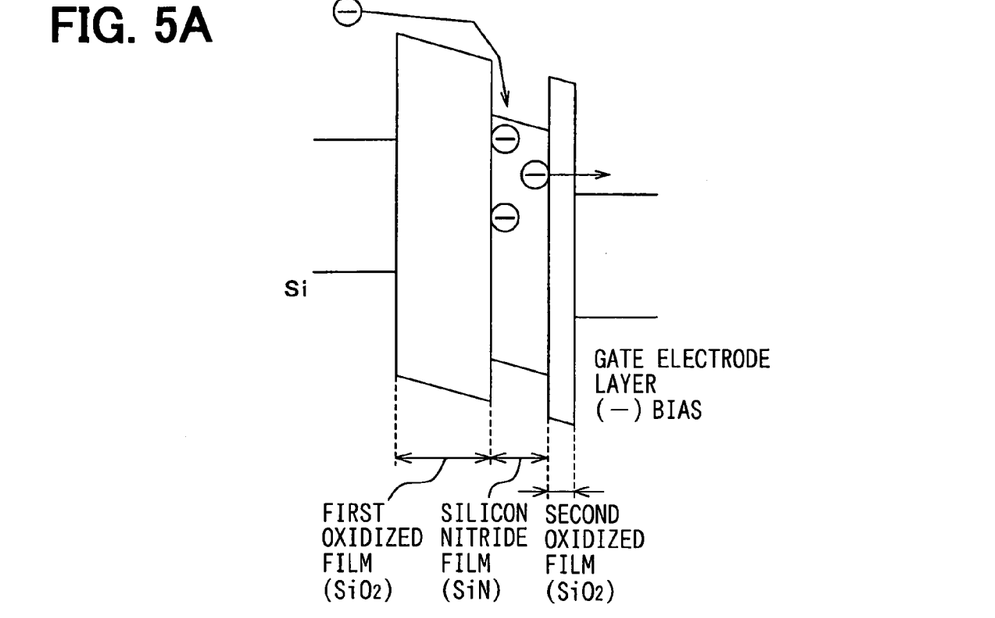
FIGS. 5A-5B are energy band diagrams of the vicinities of the gate insulating film 6 in case the thickness of the second silicon oxide film 6c is 5.5 nm and 8 nm, respectively.
Figure 5B:
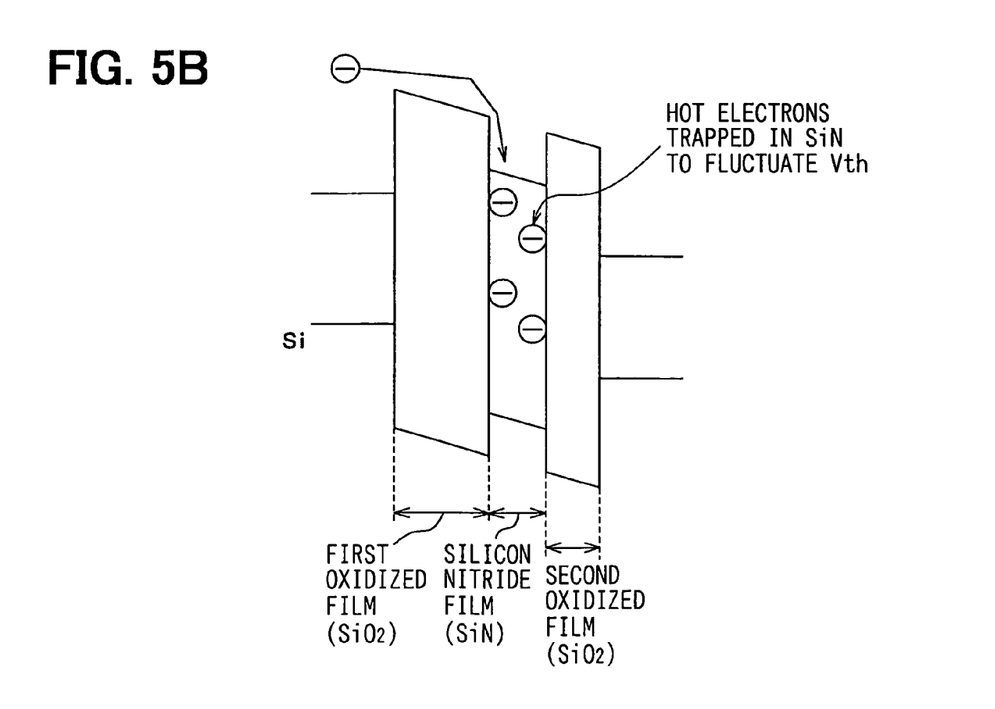

The Vt fluctuation is small, as shown, if the thickness of the second silicon oxide film 6c is within a range of 6 nm or less, but large if the same exceeds 6 nm. This will be reasoned with reference to FIG. 5.

FIGS. 5A-5B show energy band diagrams near the gate insulating film 6 of the cases, in which the thickness of the silicon oxide film 6c is set to 5.5 nm and 8 nm, respectively.

If an avalanche breakdown occurs when an inverse bias voltage is applied between the source electrode 9 and the back side metal electrode 10, hot holes and hot electrons are generated so that the hot electrons are injected into the silicon nitride film 6b. Then, the hot electrons having injected into the silicon nitride film 6b pass from the silicon oxide film 6c, if this film 6c is thin, so that the hot electrons do not reside in the silicon nitride film 6b thereby to cause no charge. In case the silicon oxide film 6c is thick, on the contrary, the hot electrons having flown into the silicon nitride film 6b may not come out of the silicon oxide film 6c so that they reside in the silicon nitride film 6b thereby to cause the charge. As a result, the Vt fluctuates by that charge.

If this Vt fluctuation occurs, the characteristics of the transistor may undesirably change. In case the transistor is of the p-channel type element, therefore, it is preferred that the thickness of the silicon oxide film 6c is set to 6 nm or less.

Thus, it is possible to prevent the hot electrons from residing in the silicon oxide film 6c. Therefore, the silicon oxide film 6c can be prevented from being charged with the hot electrons, thereby to prevent the Vt from fluctuating.

Third Embodiment

In the foregoing first embodiment, the silicon oxide film 6c is formed at the step shown in FIG. 2F, by performing the step of forming the CVD oxide film after the step of forming the thermal oxide film on the surface of the silicon nitride film 6b. However, these steps can also be reversed. Specifically, the silicon oxide film 6c may be formed by performing the step of forming the thermal oxide film after the step of forming the CVD oxide film on the surface of the silicon nitride film 6b.

In this case, the entire shape of the silicon oxide film 6c becomes slightly different from that of the case of the first embodiment, but the fundamental performances are not varied from those of the first embodiment.

Other Embodiments

The aforementioned embodiment has enumerated the transistor having the n-channel type trench gate structure. However, it is natural that the present invention can also be applied to the p-channel type, in which the individual structural components have the reversed conduction type.

Moreover, the foregoing embodiment has been described on the semiconductor device, in which the silicon nitride film 6b in the ONO film is left only on the side wall portion of the trench 5 by performing the etching treatment. However, the present invention can also be applied to the semiconductor device, in which the silicon nitride film 6b is left in the upper portion and in the bottom portion of the trench 5. In this case, it need not be taken into consideration that the thicknesses of the silicon oxide films 6d and 6e in the upper portion and in the bottom portion of the trench 5 are enlarged. Nevertheless, the aforementioned effects can be obtained by retaining the thicknesses with the silicon oxide film 6c of the two-layered structure.

The above embodiments are merely described for the purpose of exemplification of the present invention. The present invention is not limited to these embodiments. Accordingly, various modifications may be made based on the knowledge of persons skilled in the art to the above embodiments without departing from the subject matter of the present invention.

The invention claimed is:

1. A semiconductor device comprising a semiconductor element having an insulated gate structure, in which a gate insulating film having an ONO film comprised of a first silicon oxide film, a silicon nitride film and a second silicon oxide film is formed on the side face of a trench formed on one face of a semiconductor substrate, and in which a gate electrode is formed on the surface of said gate insulating film in said trench, characterized:

in that said second silicon oxide film comprises a two-layered structure films including: a thermal oxide film formed on the surface of said silicon nitride film and a CVD oxide film formed over said thermal oxide film; and in that a total thickness of said two-layered structure films is set to a value from 4 nm to 10 nm.

2. A semiconductor device as in claim 1, characterized in that the total thickness of said second silicon oxide film is set to a value from 5 nm to 10 nm.

3. A semiconductor device as set forth in claim 1, characterized in that, in case said semiconductor element is an n-channel type element, a thickness of said second silicon oxide film is set to a value from 5 nm to 10 nm.

4. A semiconductor device as set forth in claim 1, characterized in that, in case said semiconductor element is a p-channel type element, a thickness of said second silicon oxide film is set to a value from 4 nm to 6 nm.

5. A semiconductor device as set forth in claim 1, characterized in that said gate insulating film is made such that it is made of said ONO film only on the side face of said trench but made of silicon oxide films in the upper portion and in the bottom portion of said trench, and such that the silicon oxide films positioned in the upper portion and in the lower portion of said trench are made thicker than that of the ONO film positioned on the side face of said trench.

6. A semiconductor device as set forth in claim 2, characterized in that, in case said semiconductor element is an IGBT, said second silicon oxide film is made to have said thermal oxide film set to a thickness from 2.5 nm to 6 nm and to have a remaining portion made of said CVD oxide film.

7. A semiconductor device as set forth in claim 2, characterized in that, in case said semiconductor element is a MOS transistor, said second silicon oxide film is made to have said thermal oxide film set to a thickness from 1.5 nm to 4 nm and to have a remaining portion made of said CVD oxide film.

8. A method for manufacturing a semiconductor device comprising a semiconductor element having an insulated gate structure, in which a gate insulating film having an ONO film composed of a first silicon oxide film, a silicon nitride film and a second silicon oxide film is formed on the side face of a trench formed on one face of a semiconductor substrate, and in which a gate electrode is formed on the surface of said gate insulating film in said trench, characterized:

in that the step of forming said second silicon oxide film includes: the step of forming a thermal oxide film on the surface of said silicon nitride film; and the step of forming a CVD oxide film over said thermal oxide film;

in that said second silicon oxide film is made of two-layered structure films including: said thermal oxide film and said CVD oxide film; and in that the thicknesses of said thermal oxide film and said CVD oxide film are made such that the total thickness of said two-layered structure films is set to a value from 4 nm to 10 nm.

9. A method for manufacturing a semiconductor device comprising a semiconductor element having an insulated gate structure, in which a gate insulating film having an ONO film comprised of a first silicon oxide film, a silicon nitride film and a second silicon oxide film is formed on the side face of a trench formed on one face of a semiconductor substrate, and in which a gate electrode is formed on the surface of said gate insulating film in said trench, characterized:

in that the step of forming said second silicon oxide film includes: the step of forming a CVD oxide film on the surface of said silicon nitride film; and the step of forming a thermal oxide film over said CVD oxide film;

in that said second silicon oxide film is made of two-layered structure films including: said thermal oxide film and said CVD oxide film; and in that the thicknesses of said thermal oxide film and said CVD oxide film are made such that the total thickness of said two-layered structure films is set to a value from 4 nm to 10 nm.

10. A semiconductor device comprising a semiconductor element having an insulated gate structure in which a gate insulating film having an ONO film including a first silicon oxide film, a silicon nitride film and a second silicon oxide film is formed on the side face of a trench formed on one face of a semiconductor substrate, and in which a gate electrode is formed on the surface of the gate insulating film in the trench, wherein:

the second silicon oxide film comprises a two-layered film structure including a CVD film formed on the surface of said silicon nitride film and a thermal oxide film formed over said CVD film;

and a total thickness of said two-layered film structure is set to a value of 4 nm to 10 nm.

11. A semiconductor device as set forth in claim 10, characterized in that, in case said semiconductor element is a p-channel type element, a thickness of said second silicon oxide film is set to a value from 4 nm to 6 nm.

12. A semiconductor device as set forth in claim 10, characterized in that, in case said semiconductor element is an IGBT, said second silicon oxide film is made to have said thermal oxide film set to a thickness from 2.5 nm to 6 nm and to have a remaining portion made of said CVD oxide film.

13. A semiconductor device as set forth in claim 10, characterized in that, in case said semiconductor element is a MOS transistor, said second silicon oxide film is made to have said thermal oxide film set to a thickness from 1.5 nm to 4 nm and to have a remaining portion made of said CVD oxide film.

14. A semiconductor device as set forth in claim 10, characterized in that said gate insulating film is made such that it is made of said ONO film only on the side face of said trench but made of silicon oxide films in the upper portion and in the bottom portion of said trench, and such that the silicon oxide films positioned in the upper portion and in the lower portion of said trench are made thicker than that of the ONO film positioned on the side face of said trench.

* * * * *